US012799019B2

(12) United States Patent
Hirose

(10) Patent No.: US 12,799,019 B2
(45) Date of Patent: Nov. 17, 2026

(54) SEMICONDUCTOR ELEMENT COATING GLASS AND SEMICONDUCTOR ELEMENT COATING MATERIAL USING SAME

(71) Applicant: Nippon Electric Glass Co., Ltd., Shiga (JP)

(72) Inventor: Masayuki Hirose, Shiga (JP)

(73) Assignee: NIPPON ELECTRIC GLASS CO., LTD., Shiga (JP)

(*) Notice: Subject to any disclaimer, the term of this patent is extended or adjusted under 35 U.S.C. 154(b) by 830 days.

(21) Appl. No.: 17/912,971

(22) PCT Filed: Jan. 26, 2021

(86) PCT No.: PCT/JP2021/002642
§ 371 (c)(1),
(2) Date: Sep. 20, 2022

(87) PCT Pub. No.: WO2021/199625
PCT Pub. Date: Oct. 7, 2021

(65) Prior Publication Data

US 2023/0365454 A1 Nov. 16, 2023

(30) Foreign Application Priority Data

Mar. 31, 2020 (JP) ................................ 2020-061749

(51) Int. Cl.
*C03C 3/093* (2006.01)
*C03C 8/04* (2006.01)
*H10W 70/692* (2026.01)

(52) U.S. Cl.
CPC ................ *C03C 3/093* (2013.01); *C03C 8/04* (2013.01); *H10W 70/692* (2026.01)

(58) Field of Classification Search
CPC ...................................................... C03C 3/093
See application file for complete search history.

(56) References Cited

U.S. PATENT DOCUMENTS

| | | | | |
|---|---|---|---|---|
| 2009/0230861 | A1* | 9/2009 | Miyazaki .................. | C03C 8/24 313/636 |
| 2014/0206522 | A1 | 7/2014 | Yano et al. | |
| 2014/0361416 | A1 | 12/2014 | Ogasawara et al. | |
| 2016/0002093 | A1 | 1/2016 | Ito et al. | |
| 2017/0323791 | A1 | 11/2017 | Ogasawara | |
| 2019/0055155 | A1 | 2/2019 | Sridharan et al. | |

FOREIGN PATENT DOCUMENTS

| | | |
|---|---|---|
| CN | 104025267 | 9/2014 |
| JP | 11-236239 | 8/1999 |
| JP | 2018-43912 | 3/2018 |
| TW | 201811699 | 4/2018 |
| WO | 2014/038230 | 3/2014 |
| WO | 2014/155739 | 10/2014 |
| WO | 2016/067477 | 5/2016 |

OTHER PUBLICATIONS

WO_2012133217_A1, Nakamura, Junichi, English_and_original_version. (Year: 2012).*
Office Action issued Jun. 5, 2024 in corresponding Taiwanese Patent Application No. 110103389, with English-language Translation of the Search Report.
International Preliminary Report on Patentability and Written Opinion of the International Searching Authority issued Sep. 29, 2022, in International (PCT) Application No. PCT/JP2021/002642.
International Search Report dated Apr. 20, 2021 in corresponding International Application No. PCT/JP2021/002642.

* cited by examiner

*Primary Examiner* — Jennifer A Boyd
(74) *Attorney, Agent, or Firm* — Wenderoth, Lind & Ponack, L.L.P.

(57) ABSTRACT

Provided is a glass for semiconductor device coating, which is substantially free of an environmental load substance, is excellent in acid resistance, and has a low surface charge density while enabling coating at a firing temperature of 900° C. or less. The glass for semiconductor device coating of the present invention includes, as a glass composition, 40% to 65% of $ZnO+SiO_2$, 7% to 25% of $B_2O_3$, 5% to 15% of $Al_2O_3$, and 8% to 22% of MgO, and is substantially free of a lead component.

4 Claims, No Drawings

SEMICONDUCTOR ELEMENT COATING GLASS AND SEMICONDUCTOR ELEMENT COATING MATERIAL USING SAME

TECHNICAL FIELD

The present invention relates to a glass for semiconductor device coating and a material for semiconductor coating using the glass for semiconductor device coating.

BACKGROUND ART

In a semiconductor device, such as a silicon diode or a transistor, in general, a surface including a P-N junction of the semiconductor device is coated with a glass. With this configuration, stabilization of the surface of the semiconductor device can be achieved, and deterioration of the characteristics with time can be suppressed.

Examples of the characteristics required for the glass for semiconductor device coating include the following: (1) the glass for semiconductor device coating has a thermal expansion coefficient compatible with a thermal expansion coefficient of the semiconductor device so that a crack or the like due to a difference in thermal expansion coefficient with the semiconductor device may not occur; (2) coating can be performed at low temperature (e.g., 900° C. or less) to prevent deterioration of the characteristics of the semiconductor device; (3) the glass for semiconductor device coating has such acid resistance as to be free from being eroded in an acid treatment step performed after a coating layer is formed; and (4) a surface charge density is regulated in a certain range in order to optimize electrical characteristics of the semiconductor device.

A lead-based glass, such as a $PbO—SiO_2—Al_2O_3—B_2O_3$-based glass, has heretofore been known as the glass for semiconductor device coating (for example, Patent Literature 1), but from the viewpoint of avoiding containing an environmental load substance, a zinc-based glass, such as a $ZnO—B_2O_3—SiO_2$-based glass, is currently in the mainstream (see, for example, Patent Literature 2).

CITATION LIST

Patent Literature 1: JP 11-236239 A
Patent Literature 2: WO 2014/155739 A1

SUMMARY OF INVENTION

Technical Problem

However, there is a problem in that the zinc-based glass is inferior in chemical durability as compared to the lead-based glass, and hence is liable to be eroded in an acid treatment step performed after a coating layer is formed. Accordingly, a protective film needs to be further formed on a surface of the coating layer before performing the acid treatment.

In order to solve the above-mentioned problem, when the content of $SiO_2$ in a glass composition becomes larger, a reverse voltage of a semiconductor device is improved as well as acid resistance is improved, but there is a failure that a reverse leakage current of the semiconductor device is increased. In particular, in a semiconductor device for low withstand voltage, it is given a higher priority to suppress the reverse leakage current to reduce a surface charge density than to improve the reverse voltage, and hence the above-mentioned problem becomes apparent. In addition, a softening point of the glass significantly increases, and hence when coating is performed by low-temperature firing (e.g., 900° C. or less), softening flowability of the glass is impaired. Accordingly, it becomes difficult to uniformly coat the surface of the semiconductor device.

Accordingly, the present invention has been made in view of the above-mentioned circumstances, and a technical object of the present invention is to provide a glass for semiconductor device coating, which is substantially free of an environmental load substance, is excellent in acid resistance, and has a low surface charge density while enabling coating at a firing temperature of 900° C. or less.

Solution to Problem

The inventor of the present invention has made extensive investigations, and as a result, has found that the above-mentioned technical object can be achieved by using a glass having a specific composition. Thus, the finding is proposed as the present invention. That is, according to one embodiment of the present invention, there is provided a glass for semiconductor device coating, comprising as a glass composition, in terms of mol %, 40% to 65% of $ZnO+SiO_2$, 7% to 25% of $B_2O_3$, 5% to 15% of $Al_2O_3$, and 8% to 22% of MgO, and being substantially free of a lead component. Herein, the "$ZnO+SiO_2$" represents the total of the contents of ZnO and $SiO_2$. In addition, the "substantially free of" means that the explicit component is not intentionally added as a glass component, and the case in which even impurities that are inevitably mixed are completely excluded is not meant. Specifically, the case in which the content of the explicit component including impurities is less than 0.1 mass % is meant.

As described above, in the glass for semiconductor device coating according to the one embodiment of the present invention, the content range of each component is regulated. With this configuration, the glass for semiconductor device coating is substantially free of an environmental load substance, is excellent in acid resistance, and has a reduced surface charge density while enabling coating at a firing temperature of 900° C. or less. As a result, the glass for semiconductor device coating can be suitably used for coating a semiconductor device for low withstand voltage.

Further, the glass for semiconductor device coating according to the one embodiment of the present invention preferably has a molar ratio $SiO_2/ZnO$ in the glass composition of from 0.5 to 2.0. With this configuration, improvement in acid resistance and coating at a firing temperature of 900° C. or less can both be achieved.

Further, the glass for semiconductor device coating according to the one embodiment of the present invention preferably has a molar ratio $Al_2O_3/(ZnO+SiO_2)$ in the glass composition of from 0.08 to 0.30. With this configuration, meltability of the glass can be maintained while stability and acid resistance of the glass are maintained.

The glass for semiconductor device coating according to the one embodiment of the present invention preferably has a thermal expansion coefficient within the temperature range of from 30° C. to 300° C. of from $20\times10^{-7}$/° C. to $55\times10^{-7}$/° C. Herein, the "thermal expansion coefficient within the temperature range of from 30° C. to 300° C." refers to a value measured with a push-rod-type thermal expansion coefficient measurement apparatus.

According to another embodiment of the present invention, there is provided a material for semiconductor device coating, preferably comprising 75 mass % to 100 mass % of glass powder formed of the above-mentioned glass for semiconductor device coating and 0 mass % to 25 mass % of ceramic powder.

The material for semiconductor device coating according to the other embodiment of the present invention preferably has a thermal expansion coefficient within the temperature range of from 30° C. to 300° C. of from $20\times10^{-7}$/° C. to $55\times10^{-7}$/° C.

DESCRIPTION OF EMBODIMENTS

A glass for semiconductor device coating of the present invention is characterized by comprising as a glass composition, in terms of mol %, 40% to 65% of $ZnO+SiO_2$, 7% to 25% of $B_2O_3$, 5% to 15% of $Al_2O_3$, and 8% to 22% of MgO, and being substantially free of a lead component.

The reasons for limiting the content of each component are described below. The expression "%" means "mol %" in the following description of the content of each component unless otherwise stated.

$ZnO+SiO_2$ is a component that stabilizes the glass. The content of $ZnO+SiO_2$ is from 40% to 65%, preferably from 43% to 63%, more preferably from 45% to 60%, still more preferably from 47% to 58%, particularly preferably from 50% to 55%. When the content of $ZnO+SiO_2$ becomes less than 40%, vitrification at the time of melting becomes difficult, and in addition, even when the vitrification occurs, devitrification (unintended crystal) precipitates from the glass at the time of firing, and softening and flowing of the glass are inhibited, and hence it becomes difficult to uniformly coat the surface of the semiconductor device. Meanwhile, when the content of $ZnO+SiO_2$ exceeds 65%, the softening point of the glass significantly increases, and the softening and flowing of the glass at 900° C. or less are inhibited, and hence it becomes difficult to uniformly coat the surface of the semiconductor device.

ZnO is a component that stabilizes the glass. The content of ZnO is preferably from 10% to 40%, more preferably from 15% to 38%, still more preferably from 20% to 351, particularly preferably from 25% to 32%. When the content of ZnO is too small, a devitrification property at the time of melting becomes strong, and hence it becomes difficult to obtain homogeneous glass. Meanwhile, when the content of ZnO is too large, acid resistance is liable to be reduced.

$SiO_2$ is a network-forming component of the glass, and hence is a component that stabilizes the glass and enhances the acid resistance. The content of $SiO_2$ is preferably from 15% to 45%, more preferably from 18% to 42%, still more preferably from 20% to 38%, particularly preferably from 25% to 35%. When the content of $SiO_2$ is too small, there is a tendency that the acid resistance is reduced. Meanwhile, when the content of $SiO_2$ is too large, the softening point of the glass significantly increases, and the softening and flowing of the glass at 900° C. or less are inhibited, and hence it becomes difficult to uniformly coat the surface of the semiconductor device.

$B_2O_3$ is a network-forming component of the glass, and is also a component that enhances softening flowability. The content of $B_2O_3$ is from 7% to 25%, preferably from 10% to 22%, more preferably from 12% to 18%. When the content of $B_2O_3$ is too small, crystallinity becomes high, and softening flowability of the glass is impaired at the time of coating, and hence it becomes difficult to uniformly coat the surface of the semiconductor device. Meanwhile, when the content of $B_2O_3$ is too large, there are tendencies that a thermal expansion coefficient is improperly increased and the acid resistance is reduced.

$Al_2O_3$ is a component that improves the acid resistance and adjusts a surface charge density. The content of $Al_2O_3$ is from 5% to 15%, preferably from 7% to 14%, more preferably from 9% to 13%, particularly preferably from 10% to 12%. When the content of $Al_2O_3$ is too small, the glass becomes liable to devitrify, and the acid resistance is reduced. Meanwhile, when the content of $Al_2O_3$ is too large, there is a risk in that the surface charge density may become too large, and there is also a risk in that a crystal may precipitate from a glass melt at the time of melting and melting may become difficult.

MgO is a component that reduces the viscosity of the glass. The content of MgO is from 8% to 22%, preferably from 9% to 20%, more preferably from 10% to 19%, still more preferably from 11% to 18%, particularly preferably from 12% to 17%. when the content of MgO is too small, the firing temperature of the glass is liable to increase. Meanwhile, when the content of MgO is too large, there are risks in that the thermal expansion coefficient may become too high, the acid resistance may be reduced, and an insulating property may be reduced.

In order to achieve both of improvement in acid resistance and coating at a firing temperature of 900° C. or less, the molar ratio $SiO_2/ZnO$ in the glass composition is preferably from 0.5 to 2.0, from 0.6 to 1.8, or from 0.8 to 1.6, particularly preferably from 1.0 to 1.4. When the molar ratio $SiO_2/ZnO$ is too small, the acid resistance is reduced. Meanwhile, when the molar ratio $SiO_2/ZnO$ is too large, the softening point of the glass is significantly increased, the softening and flowing of the glass at 900° C. or less are inhibited, and hence it becomes difficult to uniformly coat the surface of the semiconductor device.

When the balance of $Al_2O_3$, ZnO, and $SiO_2$ in the glass composition is taken into consideration, poor meltability can be avoided while the stability and the acid resistance of the glass are maintained. The molar ratio $Al_2O_3/(ZnO+SiO_2)$ in the glass composition is preferably from 0.08 to 0.30, more preferably from 0.10 to 0.25, still more preferably from 0.12 to 0.20, particularly preferably from 0.14 to 0.18. When the molar ratio $Al_2O_3/(ZnO+SiO_2)$ is too small, the melting of the glass is liable to become difficult. Meanwhile, when the molar ratio $Al_2O_3/(ZnO+SiO_2)$ is too large, the stability and the acid resistance of the glass are liable to be reduced.

In addition to the above-mentioned components, the glass may contain another component (e.g., CaO, SrO, BaO, $MnO_2$, $Ta_2O_5$, $Nb_2O_5$, $CeO_2$, or $Sb_2O_3$) at up to 7% (preferably up to 3%).

From the environmental viewpoint, it is preferred that the glass be substantially free of a lead component (e.g., PbO) and be also substantially free of $Bi_2O_3$, F, or Cl. In addition, it is preferred that the glass be also substantially free of alkali components ($Li_2O$, $Na_2O$, and $K_2O$) that have an adverse influence on the surface of the semiconductor device.

The glass for semiconductor device coating of the present invention is preferably a powder form, that is, glass powder. When the glass for semiconductor device coating is processed into glass powder, the surface of the semiconductor device can be easily coated using, for example, a paste method or an electrophoretic coating method.

The glass powder has an average particle diameter $D_{50}$ of preferably 25 μm or less, particularly preferably 15 μm or less. When the average particle diameter $D_{50}$ of the glass powder is too large, pasting becomes difficult. In addition, powder adhesion by an electrophoretic method also becomes difficult. The lower limit of the average particle diameter $D_{50}$ of the glass powder is not particularly limited, but is realistically 0.1 μm or more. The "average particle diameter $D_{50}$" refers to a value measured on a volume basis and a value measured by a laser diffraction method.

The glass for semiconductor device coating of the present invention may be obtained by, for example, blending raw material powders of the respective oxide components to form a batch, melting the batch to cause vitrification at about 1,500° C. for about 1 hour, and then forming (and then pulverizing and classifying as required) the resultant.

A material for semiconductor device coating of the present invention contains the glass powder formed of the glass for semiconductor device coating, and may also be mixed with ceramic powder as required to form composite powder. When the ceramic powder is added, the thermal expansion coefficient can be easily adjusted.

As the ceramic powder, powders formed of zirconium phosphate, zircon, zirconia, tin oxide, aluminum titanate, quartz, β-spodumene, mullite, titania, quartz glass, β-eucryptite, β-quartz, willemite, cordierite, and the like may be used alone or as a mixture thereof.

The mixing ratio of the glass powder and the ceramic powder is as follows: preferably 75 vol % to 100 vol % of the glass powder and 0 vol % to 25 vol % of the ceramic powder; more preferably 80 vol % to 99 vol % of the glass powder and 1 vol % to 20 vol % of the ceramic powder; still more preferably 85 vol % to 95 vol % of the glass powder and 5 vol % to 15 vol % of the ceramic powder. When the content of the ceramic powder is too large, the ratio of the glass powder becomes relatively small, and softening and flowing of the glass are inhibited, and hence it becomes difficult to coat the surface of the semiconductor device.

The ceramic powder has an average particle diameter $D_{50}$ of preferably 30 μm or less, particularly preferably 20 μm or less. When the average particle diameter $D_{50}$ of the ceramic powder is too large, smoothness of the surface of a coating layer is liable to be reduced. The lower limit of the average particle diameter $D_{50}$ of the ceramic powder is not particularly limited, but is realistically 0.1 μm or more.

The material for semiconductor device coating of the present invention has a thermal expansion coefficient within the temperature range of from 30° C. to 300° C. of preferably from $20\times10^{-7}$/° C. to $55\times10^{-7}$/° C., more preferably from $30\times10^{-7}$/° C. to $50\times10^{-7}$/° C. When the thermal expansion coefficient falls outside of the above-mentioned ranges, a crack, warpage, or the like due to a difference in thermal expansion coefficient with the semiconductor device is liable to occur.

When, for example, the surface of the semiconductor device of 1,000 V or less is to be coated, the material for semiconductor device coating of the present invention has a surface charge density of preferably $12\times10^{11}$/cm$^2$ or less, more preferably $10\times10^{11}$/cm$^2$ or less. When the surface charge density is too high, withstand voltage becomes high, but at the same time, there is a tendency that a leakage current also increases. The "surface charge density" refers to a value measured by a method described in the "Examples" section to be described below.

Examples

Now, the present invention is described in detail by way of Examples. The following Examples are merely illustrative. The present invention is by no means limited to the following Examples.

Examples (Sample Nos. 1 to 4) and Comparative Examples (Sample Nos. 5 to 8) of the present invention are shown in Table 1.

TABLE 1

| | | No. 1 | No. 2 | No. 3 | No. 4 | No. 5 | No. 6 | No. 7 | No. 8 |
|---|---|---|---|---|---|---|---|---|---|
| Glass composition (mol %) | ZnO | 27 | 30 | 30 | 17 | 28 | 18 | 35 | 25 |
| | $SiO_2$ | 30 | 28 | 24 | 32 | 10 | 40 | 32 | 22 |
| | $B_2O_3$ | 16 | 15 | 17 | 20 | 25 | 16 | 7 | 26 |
| | $Al_2O_3$ | 10 | 10 | 11 | 12 | 15 | 17 | 18 | 14 |
| | MgO | 17 | 17 | 18 | 19 | 22 | 9 | 8 | 13 |
| | ZnO + $SiO_2$ | 57 | 58 | 54 | 49 | 38 | 58 | 67 | 47 |
| $SiO_2$/ZnO | | 1.11 | 0.93 | 0.80 | 1.88 | 0.36 | 2.22 | 0.91 | 0.88 |
| $Al_2O_3$/(ZnO + $SiO_2$) | | 0.18 | 0.17 | 0.20 | 0.24 | 0.39 | 0.29 | 0.27 | 0.30 |
| Glass powder (mass %) | | 100 | 100 | 100 | 85 | 100 | 100 | 100 | 100 |
| Ceramic powder (mass %) | | 0 | 0 | 0 | Cordierite 15 | 0 | 0 | 0 | 0 |
| Thermal expansion coefficient ($\times10^{-7}$/° C.) | | 44 | 45 | 46 | 31 | No vitrification | 35 | 43 | 45 |
| Surface charge density ($\times10^{11}$/cm$^2$) | | 4 | 6 | 3 | 7 | | 18 | >20 | 11 |
| Coating property | | ○ | ○ | ○ | ○ | | x | x | ○ |
| Acid resistance | | ○ | ○ | ○ | ○ | | ○ | ○ | x |

Each sample was produced as described below. First, raw material powders were blended so as to have a glass composition of Table 1 to form a batch, and the batch was melted to vitrify at 1,500° C. for 2 hours. Subsequently, the molten glass was formed into a film shape, and then pulverized with a ball mill and classified with a 350-mesh sieve to provide glass powder having an average particle diameter $D_{50}$ of 12 μm. In Sample No. 4, 15 mass % of cordierite powder (average particle diameter $D_{50}$: 12 μm) was added to the obtained glass powder to form composite powder.

For each sample, the thermal expansion coefficient, the surface charge density, the coating property, and the acid resistance were evaluated. The results are shown in Table 1.

The thermal expansion coefficient is a value measured using a push-rod-type thermal expansion coefficient measurement apparatus within the temperature range of from 30° C. to 300° C.

The surface charge density was measured as described below. First, each sample was dispersed into an organic solvent and was caused to adhere onto a surface of a silicon substrate by electrophoresis so as to have a constant film thickness. The resultant was then fired to form a coating layer. Next, an aluminum electrode was formed on a surface of the coating layer, and then a change in electric capacity in the coating layer was measured with a C-V meter, and the surface charge density was calculated.

The coating property was evaluated as described below. Each sample was collected so as to have a weight of its density, and the resultant was placed into a die having a diameter of 20 mm, and was subjected to press molding to produce a dry button. The dry button was then placed onto a glass substrate, and was fired (retention time: 10 minutes) at 900° C., and the flowability of the fired body was observed. A fired body having a flow diameter of 18 mm or more was judged to be "o", and a fired body having a flow diameter of less than 18 mm was judged to be "x".

The acid resistance was evaluated as described below. Each sample was subjected to press molding to have a diameter of 20 mm and a thickness of about 4 mm, and was then fired (retention time: 10 minutes) at 900° C. to produce a pellet-shaped sample. A change in mass per unit area was calculated from a loss of the mass of the sample after having been immersed in 30% nitric acid at 25° C. for 1 minute. The result was used as an indicator of the acid resistance. A change in mass per unit area of less than 1.0 $mg/cm^2$ was judged to be "o", and a change in mass per unit area of 1.0 $mg/cm^2$ or more was judged to be "x".

As apparent from Table 1, Sample Nos. 1 to 4 each had a surface charge density of $12\times10^{11}/cm^2$ or less, and received satisfactory evaluation for the coating property and the acid resistance. Accordingly, Sample Nos. 1 to 4 may each be suitable as a material for semiconductor device coating to be used for coating the semiconductor device for low withstand voltage.

Meanwhile, no vitrification occurred in Sample No. 5 because the content of $ZnO+SiO_2$ was small. Sample No. 6 had a large content of $Al_2O_3$, and hence the surface charge density was increased and poor. In addition, Sample No. 7 had a large content of $ZnO+SiO_2$, and hence had poor coating property. In addition, the content of $Al_2O_3$ was large, and hence the surface charge density thereof was increased and poor. Further, Sample No. 8 had a large content of $B_2O_3$, and hence had poor acid resistance.

The invention claimed is:

1. A glass for semiconductor device coating, comprising as a glass composition, in terms of mol %, 40% to 65% of $ZnO+SiO_2$, 7% to 25% of $B_2O_3$, 5% to 15% of $Al_2O_3$, and 17% to 22% of MgO, and being substantially free of a lead component, wherein the glass for semiconductor device coating has a molar ratio $SiO_2/ZnO$ of from 0.5 to 2.0, wherein the glass for semiconductor device coating has a molar ratio $Al_2O_3/(ZnO+SiO_2)$ of from 0.08 to 0.30, and wherein the glass has a surface charge density of $12\times10^{11}/cm^2$ or less, when a surface of the semiconductor device is coated by the glass.

2. The glass for semiconductor device coating according to claim 1, wherein the glass for semiconductor device coating has a thermal expansion coefficient within a temperature range of from 30° C. to 300° C. of from $20\times10^{-7}$/° C. to $55\times10^{-7}$/° C.

3. A material for semiconductor device coating, comprising:

75 mass % to 100 mass % of glass powder formed of the glass for semiconductor device coating of claim 1; and 0 mass % to 25 mass % of ceramic powder.

4. The material for semiconductor device coating according to claim 3, wherein the material for semiconductor device coating has a thermal expansion coefficient within a temperature range of from 30° C. to 300° C. of from $20\times10^{-7}$/° C. to $55\times10^{-7}$/° C.

* * * * *